United States Patent
Liu (10) Patent No.: US 12,149,714 B2
(45) Date of Patent: Nov. 19, 2024

(54) ENCODING METHOD, DECODING METHOD, ENCODING DEVICE, AND DECODING DEVICE

(71) Applicant: TCL China Star Optoelectronics Technology Co., Ltd., Shenzhen (CN)

(72) Inventor: Jinfeng Liu, Shenzhen (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/430,129

(22) PCT Filed: Jul. 16, 2021

(86) PCT No.: PCT/CN2021/106933
§ 371 (c)(1),
(2) Date: Dec. 29, 2022

(87) PCT Pub. No.: WO2022/267117
PCT Pub. Date: Dec. 29, 2022

(65) Prior Publication Data
US 2024/0015311 A1    Jan. 11, 2024

(30) Foreign Application Priority Data
Jun. 21, 2021 (CN) .......................... 202110684561.8

(51) Int. Cl.
*H04N 19/184* (2014.01)
*H03M 13/00* (2006.01)
*H04N 19/146* (2014.01)

(52) U.S. Cl.
CPC ...... *H04N 19/184* (2014.11); *H03M 13/6575* (2013.01); *H04N 19/146* (2014.11)

(58) Field of Classification Search
CPC .................................................. H03M 13/6575
See application file for complete search history.

(56) References Cited

U.S. PATENT DOCUMENTS 4,924,298 A * 5/1990 Kitamura ............. H04N 11/042
375/246
5,703,646 A * 12/1997 Oda ..................... H04N 19/177
375/E7.13
(Continued)

FOREIGN PATENT DOCUMENTS

CN  104052577 A  9/2014
CN  108694918 A  10/2018
(Continued)

OTHER PUBLICATIONS

International Search Report in International application No. PCT/CN2021/106933, mailed on Mar. 22, 2022.
(Continued)

*Primary Examiner* — Joseph D Torres
(74) *Attorney, Agent, or Firm* — Nathan & Associates; Menachem Nathan (57) ABSTRACT

An encoding method, a decoding method, an encoding device, a decoding device, a computer device, and a storage medium for providing error protection for display data. A first initial display data error-prone and a second initial display data not error-prone are filtered out, and the first initial display data being performed complex logic operations and the second initial display data being simple encoded are outputted.

18 Claims, 4 Drawing Sheets

(56) References Cited

U.S. PATENT DOCUMENTS

| | | | |
|---|---|---|---|
| 2003/0112870 A1* | 6/2003 | Fukuda | H04N 19/59 375/E7.137 |
| 2004/0131184 A1* | 7/2004 | Wu | G08B 13/19647 713/176 |
| 2009/0279596 A1 | 11/2009 | Ji et al. | |
| 2010/0164760 A1 | 7/2010 | Besten | |
| 2018/0192070 A1* | 7/2018 | Dupuis | H04N 19/513 |

FOREIGN PATENT DOCUMENTS

| | | | |
|---|---|---|---|
| CN | 110401925 A | 11/2019 | |
| CN | 110474709 A | 11/2019 | |
| CN | 112492386 A | 3/2021 | |
| CN | 112929032 A | 6/2021 | |
| CN | 112947875 A | 6/2021 | |
| WO | 2021003424 A1 | 1/2021 | |

OTHER PUBLICATIONS

Written Opinion of the International Search Authority in International application No. PCT/CN2021/106933, mailed on Mar. 22, 2022.

Chinese Office Action issued in corresponding Chinese Patent Application No. 202110684561.8 dated Feb. 18, 2023, pp. 1-8.

* cited by examiner

ENCODING METHOD, DECODING METHOD, ENCODING DEVICE, AND DECODING DEVICE

BACKGROUND

Field of Invention

The present disclosure relates to the field of digital signal processing technology, and more particularly, to an encoding method, a decoding method, an encoding device, and a decoding device.

Description of the Prior Art

In existing thin-film transistor liquid crystal display (TFT-LCD) products, a digital signal is transmitted from a Tcon terminal to a driver terminal in a digital channel, and a digital signal to be transmitted needs to be encoded before a baseband transmission. Since there is no independent clock signal during the transmission, and the clock signal is embedded in the digital signal to be transmitted, a receiving terminal is likely to misidentify the embedded clock signal, when six or more continuous 0 or continuous 1 appear in the digital signal to be transmitted. Therefore, the digital signal to be transmitted needs to be encoded to make the digital signal be a square wave with a certain jump, so as to avoid too many continuous 0 or 1, which easy cause errors in a clock synchronization information received by the receiving terminal, and eventually lead to bit errors.

At present, a most widely used coding scheme in the field of data transmission is realized by a series of logical operations, and usually logical operations are performed on all data packages (i.e. bit streams), which takes a lot of time for data encoding and decoding during data transmission, and affects a response time and an image quality resulting from slow data transmission.

SUMMARY

The present disclosure provides an encoding method, a decoding method, an encoding device, and a decoding device, which aim to solve a problem of a slow transmission due to an excessive encoded data in an encoding method in the prior art.

In a first aspect, the present disclosure provides an encoding method, and the method includes:
obtaining an initial display data to be transmitted;
determining a first initial display data error-prone in the initial display data, and a second initial display data not error-prone in the initial display data;
encoding the first initial display data by a first preset logic operation to obtain a first display data;
encoding the second initial display data by a second preset logic operation to obtain a second display data; and
outputting an encoded display data, and the encoded display data includes the first display data and the second display data.

Further, the initial display data includes at least one eight-bit data, and taking any data of the initial display data as a first target data; the step of determining the first initial display data error-prone in the initial display data, and the second initial display data not error-prone in the initial display data includes:
determining whether the first target data has a continuous preset number of 0 or 1 according to a preset signal transmission criterion;
if yes, the first target data is determined to be the first initial display data error-prone;
if no, the first target data is determined to be the second initial display data not error-prone.

Further, the step of determining whether the first target data has the continuous preset number of 0 or 1 according to the preset signal transmission criterion includes:
determining whether logical values from a fourth bit data to a seventh bit data in the first target data are the same.

Further, the step of determining whether the first target data has the continuous preset number of 0 or 1 according to the preset signal transmission criterion includes:
determining whether logical values from a zeroth bit data to a fifth bit data in the first target data are the same.

Further, the step of determining whether the first target data has the continuous preset number of 0 or 1 according to the preset signal transmission criterion includes:
determining whether logical values from a first bit data to a sixth bit data in the first target data are the same.

Further, the step of determining whether the first target data has the continuous preset number of 0 or 1 according to the preset signal transmission criterion includes:
determining whether logical values from a zeroth bit data to the fourth bit data in the first target data are the same, and logic values of the sixth bit data and a seventh bit data are opposite.

Further, the first initial display data includes at least the eight-bit data, and taking any data of the first initial display data as a second target data; the step of encoding the first initial display data by the first preset logic operation to obtain the first display data includes:
performing an exclusive OR operation or an exclusive NOR operation on a zeroth bit data and a first bit data in the second target data to obtain an exclusive OR value, or an exclusive NOR value;
determining whether the exclusive OR value or the exclusive NOR value is 1;
if the exclusive OR value or the exclusive NOR value is 1, performing a negation operation on a first preset data in the second target data to obtain a first bit data; and
replacing the first preset data in the second target data with the first bit data to obtain the first display data.

Further, the step of replacing the first preset data in the second target data with the first bit data to obtain the first display data includes:
taking the zeroth bit data in the second target data as a first encoded data;
performing a negation operation on the first encoded data to obtain a second bit data; and
inserting the second bit data into a first bit of the second target data to obtain the first display data.

Further, the method further includes:
if the exclusive OR value or the exclusive NOR value is not 1, performing a negation operation on a second preset data in the second target data to obtain a third bit data; and
replacing the second preset data in the second target data with the third bit data to obtain the first display data.

Further, the initial display data includes at least the eight-bit data, and taking any data of the second initial display data as a third target data; the step of encoding the second initial display data by the second preset logic operation to obtain the second display data includes:
selecting a zeroth bit data in the third target data as a second encoded data;
performing a negation operation on the second encoded data to obtain a third bit data; and inserting the third bit data into a first bit of the third target data to obtain the second display data.

In the second aspect, the present disclosure further provides a decoding method, wherein the method includes:
  obtaining an encoded data to be decoded;
  determining a third preset data configured to perform a preset logic operation in the encoded data;
  decoding the third preset data by a third preset logic operation to obtain a fourth bit data; and
  replacing the third preset data in the encoded data with the fourth bit data to obtain a decoded initial display data.

In the third aspect, the present disclosure provides an encoding device, wherein the encoding device includes:
  a first obtaining unit, configured to obtain an initial display data to be transmitted;
  a first determining unit, configured to determine a first initial display data error-prone in the initial display data, and a second initial display data not error-prone in the initial display data;
  a first encoding unit, configured to encode the first initial display data by a first preset logic operation to obtain a first display data;
  a second encoding unit, configured to encode the second initial display data by a second preset logic operation to obtain a second display data; and
  an outputting unit, configured to output an encoded display data, and the encoded display data includes the first display data and the second display data.

Further, the initial display data includes at least one eight-bit data, and taking any data of the initial display data as a first target data, and the first determining unit is configured to:
  determine whether the first target data has a continuous preset number of 0 or 1 according to a preset signal transmission criterion;
  determine the first target data to be the first initial display data error-prone, if yes; and
  determine the first target data to be the second initial display data not error-prone, if no.

Further, the first determining unit is further configured to:
  determine whether logical values from a fourth bit data to a seventh bit data in the first target data are the same; or determine whether logical values from a zeroth bit data to a fifth bit data in the first target data are the same.

Further, the first initial display data includes at least the eight-bit data, and taking any data of the first initial display data as a second target data; the first encoding unit is configured to:
  perform an exclusive OR operation or an exclusive NOR operation on a zeroth bit data and a first bit data in the second target data to obtain an exclusive OR value, or an exclusive NOR value;
  determine whether the exclusive OR value or the exclusive NOR value is 1;
  perform a negation operation on a first preset data in the second target data to obtain a first bit data, if the exclusive OR value or the exclusive NOR value is 1; and
  replace the first preset data in the second target data with the first bit data to obtain the first display data.

Further, the first encoding unit is configured to:
  take the zeroth bit data in the second target data as a first encoded data;
  perform a negation operation on the first encoded data to obtain a second bit data; and
  insert the second bit data into a first bit of the second target data to obtain the first display data.

Further, the second initial display data includes at least the eight-bit data, and taking any data of the second initial display data as a third target data; and the second encoding unit is configured to:
  select a zeroth bit data in the third target data as a second encoded data;
  perform a negation operation on the second encoded data to obtain a third bit data; and
  insert the third bit data into a first bit of the third target data to obtain the second display data.

In a fourth aspect, the present disclosure provides a decoding device, wherein the decoding device includes:
  a second obtaining unit, configured to obtain an encoded data to be decoded;
  a second determining unit, configured to determine a third preset data configured to perform a preset logic operation in the encoded data;
  a decoding unit, configured to decode the third preset data by a third preset logic operation to obtain a fourth bit data;
  a replacing unit, configured to replace the third preset data in the encoded data with the fourth bit data to obtain a decoded initial display data.

In a fifth aspect, the present further disclosure provides a computer device, wherein the computer device includes:
  one or more processors;
  a memory; and
  one or more application programs, wherein the one or more application programs are stored in the memory and configured to be executed by the processor to implement the encoding method as described in any one of the above, or configured to be executed by the processor to implement the decoding method as described in any one of the above.

In a sixth aspect, the present further disclosure provides a computer-readable storage medium with a computer program stored thereon, and the computer program is loaded by a processor to execute steps in the encoding method as described in any one of the above, or to execute steps in the decoding method as described in any one of the above.

The present disclosure provides the encoding method, the decoding method, the encoding device, and the decoding device. The first initial display data error-prone and the second initial display data not error-prone are filtered out from the initial display data to be transmitted, and the first initial display data being performed complex logic operations and the second initial display data being simple encoded are outputted to reduce a complexity of encoding calculations, to achieve a high quality data transmission with minimal calculations, and to improve a transmission efficiency.

BRIEF DESCRIPTION OF DRAWINGS

Technical solutions and other beneficial effects of the present disclosure will be made obvious by describing specific implementation manners of the present disclosure in detail below in conjunction with the accompanying drawings.

DETAILED DESCRIPTION OF EMBODIMENTS

Embodiments of the present disclosure are clearly and completely described below in conjunction with the drawings in the embodiments of the present disclosure. It is clear that the described embodiments are part of embodiments of the present disclosure, but not all embodiments. Based on the embodiments of the present disclosure, all other embodiments to those of ordinary skill in the premise of no creative efforts obtained, should be considered within the scope of protection of the present disclosure.

In the description of the present disclosure, it should be understood that orientations or position relationships indicated by the terms "center", "longitudinal", "lateral", "length", "width", "thickness", "upper", "lower", "front", "rear", "left", "right", "vertical", "horizontal", "top", "bottom", "inside", "outside", "clockwise", and "counter-clockwise" are based on orientations or position relationships illustrated in the drawings. The terms are used to facilitate and simplify the description of the present disclosure, rather than indicate or imply that the devices or elements referred to herein are required to have specific orientations or be constructed or operate in the specific orientations. Accordingly, the terms should not be construed as limiting the present disclosure. In addition, the term "first", "second" are for illustrative purposes only and are not to be construed as indicating or imposing a relative importance or implicitly indicating the number of technical features indicated. Thus, a feature that limited by "first", "second" may expressly or implicitly include at least one of the features. In the description of the present disclosure, the meaning of "plural" is two or more, unless otherwise specifically defined.

In the description of the present disclosure, it should be noted that unless otherwise clearly defined and limited, the terms "mounted", "connected/coupled", and "connection" should be interpreted broadly. For example, the terms may refer to a fixed connection, a detachable connection, or an integral connection; the terms may also refer to a mechanical connection, an electrical connection, or communication with each other; the terms may further refer to a direct connection, an indirect connection through an intermediary, or an interconnection between two elements or interactive relationship between two elements. Those skilled in the art can understand the specific meanings of the above-mentioned terms in the present disclosure according to circumstances.

In the present disclosure, it should be noted that unless otherwise clearly defined and limited, a first feature "on" or "under" a second feature may mean that the first feature directly contacts the second feature, or that the first feature contacts the second feature via an additional feature there between instead of directly contacting the second feature. Moreover, the first feature "on", "above", and "over" the second feature may mean that the first feature is right over or obliquely upward over the second feature or mean that the first feature has a horizontal height higher than that of the second feature. The first feature "under", "below", and "beneath" the second feature may mean that the first feature is right beneath or obliquely downward beneath the second feature or mean that that horizontal height of the first feature is lower than that of the second feature.

The following description provides various embodiments or examples for implementing various structures of the present disclosure. To simplify the description of the present disclosure, parts and settings of specific examples are described as follows. Certainly, they are only illustrative, and are not intended to limit the present disclosure. Further, reference numerals and reference letters may be repeated in different examples. This repetition is for purposes of simplicity and clarity and does not indicate a relationship of the various embodiments and/or the settings. Furthermore, the present disclosure provides specific examples of various processes and materials, however, applications of other processes and/or other materials may be appreciated those skilled in the art.

The present disclosure provides an encoding method, a decoding method, an encoding device, and a decoding device, which are respectively described below.

Figure 1:
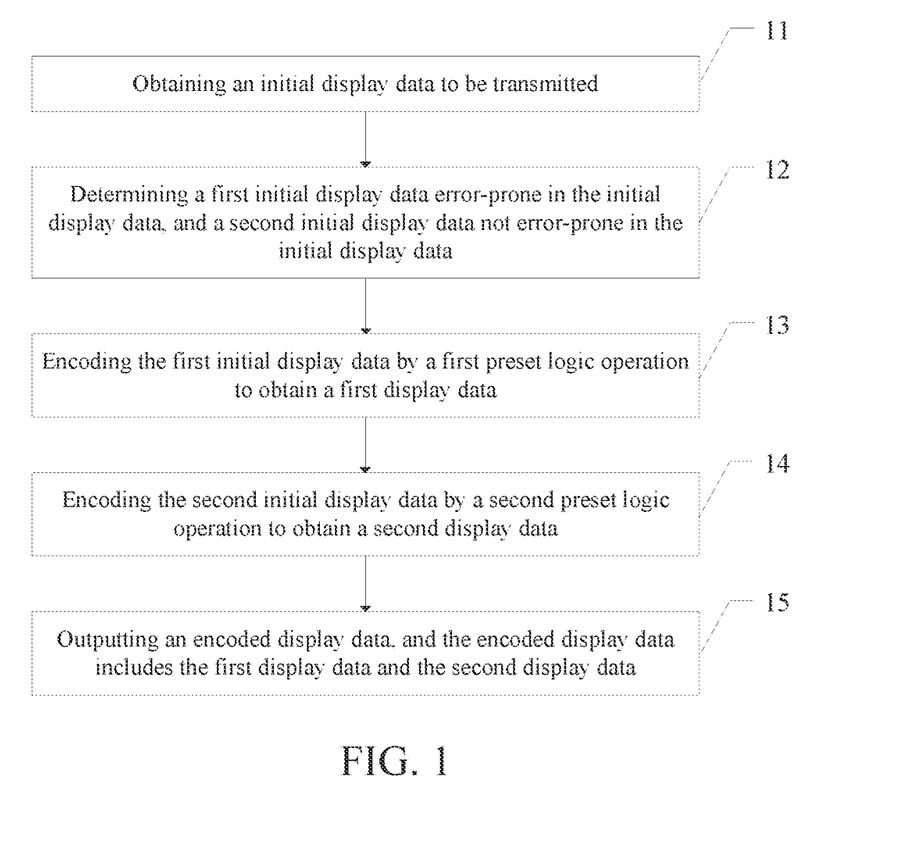
FIG. 1 is a flow schematic diagram of an encoding method according to an embodiment of the present disclosure.

As shown in FIG. 1, FIG. 1 is a flow schematic diagram of the encoding method according to an embodiment of the present disclosure, and the encoding method can include:

11, Obtaining an initial display data to be transmitted.

In an embodiment of the present disclosure, the initial display data to be transmitted can include at least one eight-bit data, for example: M[7:0]=01010011, etc. And in the embodiment of the present disclosure, the eight-bit data corresponding to the initial display data starts from a zeroth position and ends at a seventh position.

12, Determining a first initial display data error-prone in the initial display data, and a second initial display data not error-prone in the initial display data.

Specifically, in the embodiment of the present disclosure, any one of the initial display data can be configured as a first target data. And the step of determining the first initial display data error-prone in the initial display data, and the second initial display data not error-prone in the initial display data, can include: determining whether the first target data has a continuous preset number of 0 or 1; if yes, the first target data is determined to be the first initial display data error-prone; if no, the first target data is determined to be the second initial display data not error-prone.

In a signal transmission process, a signal transmission criterion exists, that is, there are as few continuous 0 or 1 as possible in a transmission data, so as to ensure an accuracy of a data transmission. If a data has multiple continuous 0 or 1, there is a high probability to occur bit errors during the data transmission. In the embodiment of the present disclosure, a preset number of continuous 0 or 1 can be five. That is, determining whether there are five continuous 0 or 1 in the first target data.

When a number of continuous 0 or 1 in the first target data does not exceed 5, bit errors are unlikely to occur during the data transmission, and a quality of the data in the transmission is guaranteed. Therefore, in an embodiment of the present disclosure, it is necessary to determine the first initial display data prone-error in the initial display data and the second initial display data prone-error in the initial display data according to the preset signal transmission criterion.

In a specific embodiment of the present disclosure, the step of determining whether the first target data has the preset number of continuous 0 or 1 can include: determining whether logical values of a fourth bit data to the seventh bit data in the first target data are the same.

Specifically, because the first target data is eight-bit data, and the logical value of each bit data of the eight-bit data from a zeroth bit to the seventh bit is 0 or 1, if the logic values from the fourth bit data to the seventh bit data of the first target data are the same, four continuous data with a same logic value exist in the first target data. A probability of error in the first target data during the transmission becomes lager, and the first target data needs to be encoded.

In other embodiments of the present disclosure, the step of determining whether the first target data has the continuous preset number of 0 or 1 according to the preset signal transmission criterion further includes: determining whether logical values from the zeroth bit data to the fourth bit data in the first target data are the same.

In other embodiments, it can further determine whether logical values from the first bit data to the sixth bit data in the first target data are the same, or determine whether logical values from the zeroth bit data to the fourth bit data in the first target data are the same, and logic values of the sixth bit data and the seventh bit data are opposite.

13, Encoding the first initial display data by a first preset logic operation to obtain a first display data.

Wherein, in a transmission process of the initial display data, the initial display data is usually encoded, and an encoded data is transmitted. Different encoding methods are configured to encode the initial display data to increase or decrease an amount of encoding calculations.

The first initial display data is prone to error during the transmission process. Therefore, a more complicated encoding method is necessary to be configured to encode the first initial display data to ensure that a first display data obtained after encoding is not prone to error in the transmission process.

In the embodiment of the present disclosure, the first preset logic operation can be configured to encode the first initial display data to obtain the first display data.

14, Encoding the second initial display data by a second preset logic operation to obtain a second display data.

Wherein, in the transmission process of the initial display data, the initial display data is usually encoded, and the encoded data is transmitted. Since the second initial display data is not prone to error, there is no need to perform the more complicated encoding method on the second initial display data, and error is less likely to occur during the transmission process. Therefore, the second initial display data can be encoded by the second preset logic operation to obtain the second display data.

15, Outputting an encoded display data, and the encoded display data includes the first display data and the second display data.

In above embodiments, the first display data obtained after a complex encoding and the second display data after a simple encoding are directly output. That is, the encoded data that needs to be transmitted after the initial display data is encoded.

The present disclosure provides the encoding method. The first initial display data error-prone and the second initial display data not error-prone are filtered out from the initial display data to be transmitted, and the first initial display data being performed complex logic operations and the second initial display data being simple encoded are outputted to reduce a complexity of encoding calculations, to achieve a high quality data transmission with minimal calculations, and to improve a transmission efficiency.

Figure 2:
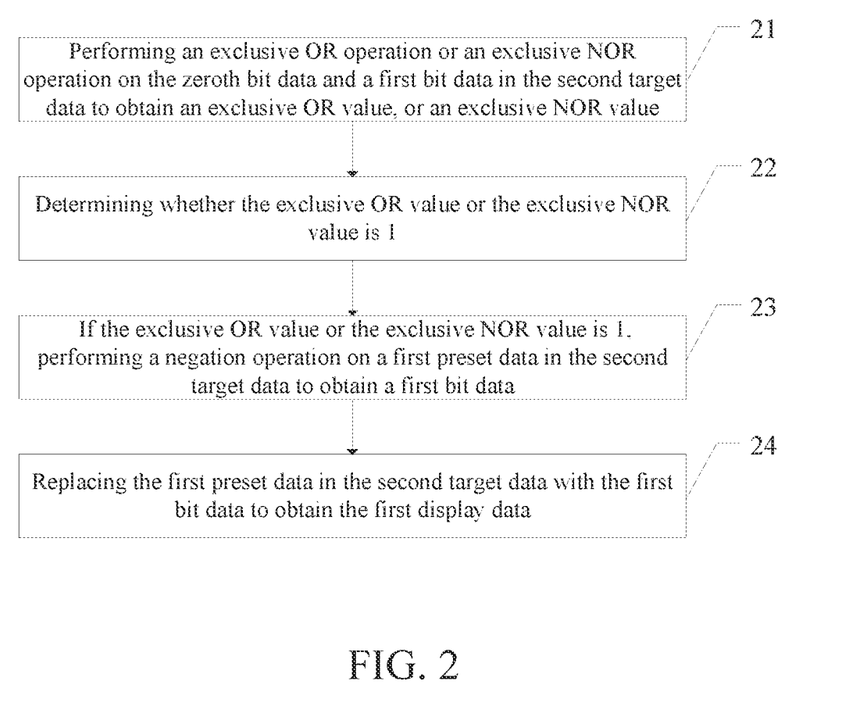
FIG. 2 is a flow schematic diagram of obtaining a first display data according to an embodiment of the present disclosure.

As shown in FIG. 2, the present disclosure provides a flow schematic diagram of obtaining the first display data according to an embodiment. And the step of obtaining the first display data can include:

21, Performing an exclusive OR operation or an exclusive NOR operation on the zeroth bit data and a first bit data in the second target data to obtain an exclusive OR value, or an exclusive NOR value.

Specifically, taking any data of the first initial display data prone-error as a second target data. The second target data can be an eight-bit data, and the eight-bit data is arranged in a certain order, for example, it can be: M[7:0]=01010011. Different second target data has a different specific method encoding.

In an embodiment of the present disclosure, the exclusive OR operation or the exclusive NOR operation can be performed on M[0] and M[1] of the second target data to obtain the exclusive OR value or the exclusive NOR value. Specifically, if M[0]=0 and M[1]=1, the exclusive OR value of M[0] and M[1] is 1, and the exclusive NOR value of M[0] and M[1] is 0.

In other embodiments of the present disclosure, it further can determine whether the exclusive OR value or the exclusive NOR value between M[6] and M[7] is 1.

22, Determining whether the exclusive OR value or the exclusive NOR value is 1

23, If the exclusive OR value or the exclusive NOR value is 1, performing a negation operation on a first preset data in the second target data to obtain a first bit data.

In an embodiment of the present disclosure, when encoding the first initial display data, only a part of bit data in the first initial display data is actually encoded by the preset logical operation to reduce a logical operation. Therefore, when the exclusive OR value or the exclusive NOR value is 1, performing a negation operation on a first preset data in the second target data to obtain a first bit data. That is, the first preset logic operation at this time is a negation operation.

In a specific embodiment, if the exclusive OR value or the exclusive NOR value is 1, N[1]=−M[1], N[4]=−M[4], N[7]=−M[7], and N[6]=−M[6] in the encoding data N[8:0]. That is, the first preset data in the second target data at this time is M[1], M[4], M[7] and M[6].

24, Replacing the first preset data in the second target data with the first bit data to obtain the first display data.

In an embodiment of the present disclosure, after performing the logical operation on the first preset data in the second target data to obtain the first bit data, the first preset data in a corresponding position of the second target data is replaced with the first bit data to obtain the first display data.

For example, in the second target data, replacing M[1] with N[1], replacing M[4] with N[4], replacing M[6] with N[6], and replacing M[7] with N[7] to get the first display data.

It should be noted that, in above embodiments, the eight-bit data is still obtained after replacing the first preset data with the first bit data. But in an actual encoding process, the encoded data usually has more bits than the initial display data. For example, the initial display data is an eight-bit data, while the encoded data can be a nine-bit data or a ten-bit data, etc.

Therefore, after replacing the first preset data with the first bit data, the zeroth bit data in the second target data further needs to be taken as a first encoded data. Performing the negation operation on the first encoded data to obtain a second bit data. Inserting the second bit data into a first bit of the second target data to obtain the first display data finally. The first display data at this time is the nine-bit data.

In a specific embodiment, taking the second target data M[7:0]=01010011 as an example, and selecting the zeroth bit data M[0]=0 as an encoding data. Performing the negation operation on the encoding data M[0]=0 to obtain −M[0]=1, that is, obtain the second bit data.

Then insert the second bit data into the first bit of the second target data, and replace the first preset data in the second target data with the first bit data at the same time, and finally obtain the first display data N[8:0]=110011000. Because a bit data is inserted, a bit number of the first display data is one more than a bit number of the initial display data, that is, the first display data is the nine-bit data.

It should be noted that, in above embodiments, the second bit data can be inserted into the second target data first, or the first preset data can be replaced with the first bit data first.

In other embodiments, if the exclusive OR value or the exclusive NOR value is not 1, performing the negation operation on the second preset data in the second target data to obtain a third bit data. Replacing the second preset data in the second target data with the third bit data to obtain the first display data.

That is, in the embodiment of the present disclosure, selecting data in the second target data to perform the logical operation according to whether the exclusive OR value or the exclusive NOR value is 1. When the exclusive OR value or the exclusive NOR value is 1, performing the first preset logical operation on the first preset data in the second target data. When the exclusive OR value or the exclusive NOR value is not 1, performing the first preset logical operation on the second preset data in the second target data.

Specifically, when the exclusive OR value or the exclusive NOR value is not 1, N[0]=−M[0], N[5]=−M[5], N[7]=−M[7] And N[6]=−M[6]. After obtaining the third bit data by an above method, an encoded first display data can be obtained.

It should be noted that the encoded first display data is the nine-bit data no matter which position of bit data in the first target data is encoded. Therefore, the second bit data is still be inserted to obtain the first display data finally, when the second display data is replaced with the third bit data.

In other embodiments of the present disclosure, for the second initial display data not prone-error, only simple encoding is required. Specifically, taking any eight-bit data in the second initial display data as the third target data, the step of the second preset logic operation is configured to encode the second initial display data to obtain the second display data can include: Selecting the zeroth bit data in the third target data as a second encoded data. Performing the negation operation on the second encoded data to obtain a third bit data. Inserting the third bit data into a first bit of the third target data to obtain the second display data.

Specifically, for the third target data, only select the zeroth bit data in the third target data as the second encoded data, and perform the second preset logic operation on the second encoded data to obtain the third bit data. Then insert the third bit data into the first bit in the third target data. There is no need to encode bit data at other positions in the third target data, and reducing the amount of the encoding calculations.

Specifically, a third bit data −M[0] is directly obtained, and then −M[0] is inserted into the first bit of the third target data to obtain N[8:0].

Figure 3:
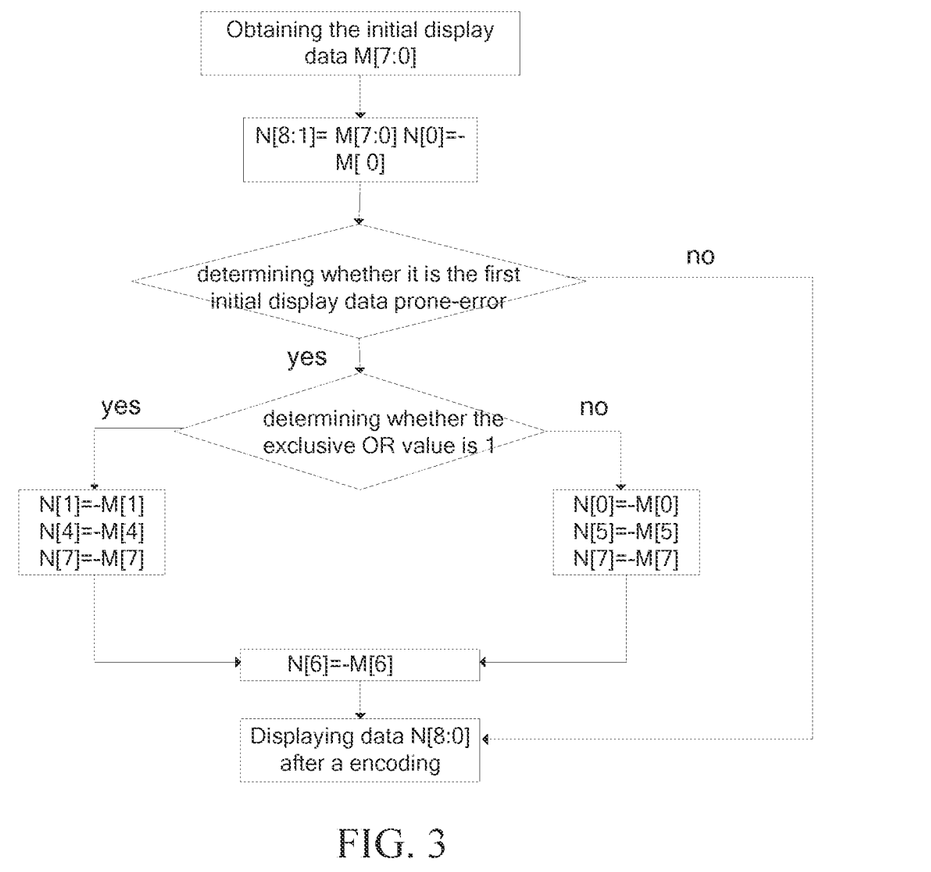
FIG. 3 is a flow schematic diagram of an encoding process according to an embodiment of the present disclosure.

As shown in FIG. 3, the present disclosure provides a flow schematic diagram of an encoding process according to an embodiment. And the encoding process can include: Obtaining the initial display data M[7:0] to be encoded, and all initial display data can be simply encoded first to obtain N[8:1]=M[7:0], and N[0]=−M[0]. Then, according to the preset signal transmission criterion, determining the first initial display data prone-error. If the initial display data is the second initial display data not prone-error, taking −M[0] as the third bit data, and the third bit data is directly inserted into the second initial display data. That is, obtaining the encoded second display data corresponding to the second initial display data. That is, N[0]=−M[0] is inserted into N[8:1] to obtain N[8:0].

If the initial display data is the first initial display data prone-error, it is necessary to determine whether the exclusive OR value between M[0] and M[1] is 1. Determining bit data needs to be encoded in the first initial display data according to the exclusive OR value. When the exclusive OR value is 1, performing the first preset logic operation on the first preset data in the first initial display data. When the exclusive OR value is not 1, performing the first preset logic operation on the second preset data in the first initial display data.

Specifically, when the exclusive OR value is 1, N[1]=−M[1], N[4]=−M[4], N[7]=−M[7], and N[6]=−M[6]. When the exclusive OR value is not 1, N[0]=−M[0], N[5]=−M[5], N[7]=−M[7] and N[6]=−M[6]. And the bit data at other positions remain unchanged.

In above embodiments, the encoded data N[8:1] is still eight-bit data, N[0]=−M[0] needs to be inserted into N[8:1] to obtain a final first display data.

An embodiment of the present disclosure further provides a decoding method, including: Obtaining an encoded data to be decoded. Determining a third preset data configured to perform a preset logic operation in the encoded data. Decoding the third preset data by a third preset logic operation to obtain a fourth bit data. Replacing the third preset data in the encoded data with the fourth bit data to obtain a decoded initial display data.

Wherein, since the first initial display data prone-error and the second initial display data not prone-error are performed by a different encoding during performing the encoding, it is actually necessary to distinguish a first encoded data prone-error and a second encoded data not prone-error in a decoding process And the first encoded data prone-error and the second encoded data not prone-error are for the initial display data before encoding.

For the first encoded data prone-error, an encoded third preset data in the first encoded data should be determined to decode the third preset data.

At the same time, since the decoded initial display data is an eight-bit data, and the encoded data is the ninth bit data, the data, usually the first bit data, inserted into the encoded data should be removed.

Figure 4:
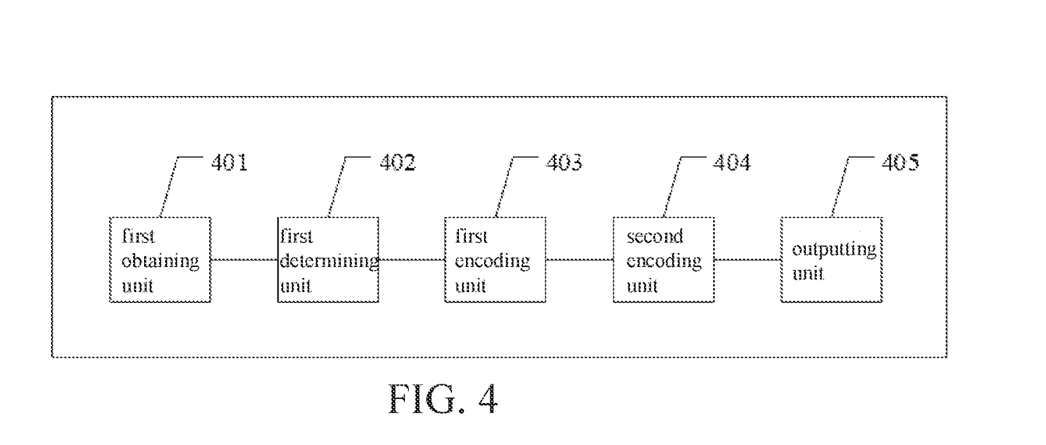
FIG. 4 is a schematic diagram of an encoding device according to an embodiment of the present disclosure.

The present disclosure further provides an encoding device. As shown in FIG. 4, FIG. 4 is a schematic diagram of an encoding device according to an embodiment of the present disclosure. The encoding device includes: a first obtaining unit 401, configured to obtain the initial display data to be transmitted; a first determining unit 402, configured to determine the first initial display data error-prone in the initial display data, and the second initial display data not error-prone in the initial display data; a first encoding unit 403, configured to encode the first initial display data by the first preset logic operation to obtain the first display data; a second encoding unit 404, configured to encode the second initial display data by the second preset logic operation to obtain the second display data; and an outputting unit 405, configured to output the encoded display data, and the encoded display data includes the first display data and the second display data.

The present disclosure provides the encoding device. The first initial display data error-prone and the second initial display data not error-prone are filtered out from the initial display data to be transmitted, and the first initial display data being performed complex logic operations and the second initial display data being simple encoded are outputted to reduce a complexity of encoding calculations, to achieve a high quality data transmission with minimal calculations, and to improve a transmission efficiency.

In some embodiments of the present disclosure, wherein the initial display data includes at least one eight-bit data, and taking any data of the initial display data as a first target data, and the first determining unit can be specifically configured to: determine whether the first target data has the continuous preset number of 0 or 1 according to the preset signal transmission criterion; determine the first target data to be the first initial display data error-prone, if yes; and determine the first target data to be the second initial display data not error-prone, if no.

In an above embodiment, the first determining unit 402 is further configured to: determine whether logical values from the fourth bit data to the seventh bit data in the first target data are the same; or determine whether logical values from the zeroth bit data to a fifth bit data in the first target data are the same.

In other embodiments of the present disclosure, the initial display data includes at least the eight-bit data, and taking any data of the initial display data as the second target data; the first encoding unit 403 can be specifically configured to: perform the exclusive OR operation or the exclusive NOR operation on the zeroth bit data and the first bit data in the second target data to obtain the exclusive OR value, or the exclusive NOR value; determine whether the exclusive OR value or the exclusive NOR value is 1; perform the negation operation on a first preset data in the second target data to obtain the first bit data, if the exclusive OR value or the exclusive NOR value is 1; and replace the first preset data in the second target data with the first bit data to obtain the first display data.

In an above embodiment, the first encoding unit 403 is further configured to: take the zeroth bit data in the second target data as the first encoded data; perform the negation operation on the first encoded data to obtain the second bit data; and insert the second bit data into the first bit of the second target data to obtain the first display data.

In an above embodiment, the second initial display data includes at least the eight-bit data, and taking any data of the initial display data as the third target data; and the second encoding unit 404 can be specifically configured to: select a zeroth bit data in the third target data as a second encoded data; perform a negation operation on the second encoded data to obtain a third bit data; and insert the third bit data into a first bit of the third target data to obtain the second display data.

Figure 5:
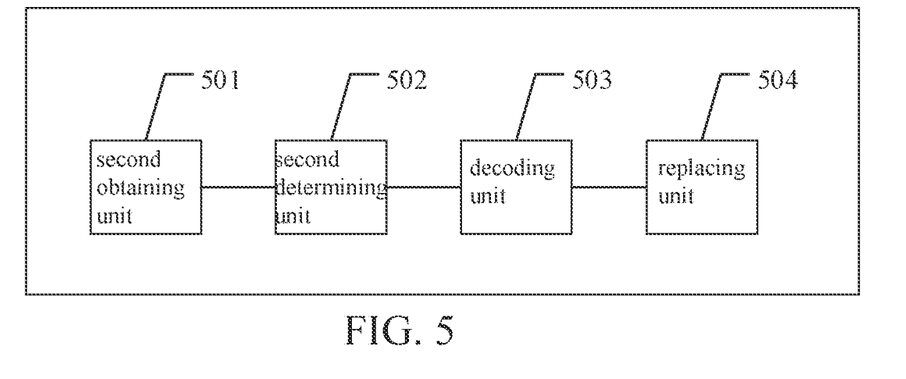
FIG. 5 is a schematic diagram of a decoding device according to an embodiment of the present disclosure.

An embodiment of the present disclosure further provides a decoding device, as shown in FIG. 5, FIG. 5 is a schematic diagram of a decoding device according to an embodiment of the present disclosure. The decoding device further includes: a second obtaining unit 501, configured to obtain the encoded data to be decoded; a second determining unit 502, configured to determine the third preset data configured to perform the preset logic operation in the encoded data; a decoding unit 503, configured to decode the third preset data by the third preset logic operation to obtain the fourth bit data; and a replacing unit 504, configured to replace the third preset data in the encoded data with the fourth bit data to obtain the decoded initial display data.

The present disclosure further provides a computer device, and the computer device includes: one or more processors; a memory; and one or more application programs, wherein the one or more application programs are stored in the memory and configured to be executed by the processor to implement the encoding method as described in any one of the above, or configured to be executed by the processor to implement the decoding method as described in any one of the above.

The present disclosure further provides a computer-readable storage medium with a computer program stored thereon, and the computer program is loaded by a processor to execute steps in the encoding method as described in any one of the above, or to execute steps in the decoding method as described in any one of the above.

In above-mentioned embodiments, the description of each embodiment has its own emphasis. For parts that are not described in detail in an embodiment, reference may be made to related descriptions of other embodiments.

The encoding method, the decoding method, the encoding device, and the decoding device provided by the embodiment of the present disclosure have been described in detail above. Specific examples are used in the disclosure to illustrate the principle and implementation of the present disclosure. The description of the above embodiments is only configured to help understand the method and the core idea of the present disclosure. At the same time, for those skilled in the art, according to the idea of the present disclosure, there will be changes in the specific implementation and the scope of disclosure. In summary, the content of the specification should not be construed as a limit to the present disclosure.

What is claimed is:

1. An encoding method, wherein the method comprises:
   obtaining an initial display data to be transmitted;
   determining a first initial display data error-prone in the initial display data, and a second initial display data not error-prone in the initial display data;
   encoding the first initial display data by a first preset logic operation to obtain a first display data;
   encoding the second initial display data by a second preset logic operation to obtain a second display data; and
   outputting an encoded display data, and the encoded display data comprises the first display data and the second display data.

2. The encoding method as claimed in claim 1, wherein the initial display data comprises at least one eight-bit data, and taking any data of the initial display data as a first target data, and the first target data comprises a zeroth bit data, a first bit data, a second bit data, a third bit data, a fourth bit data, a fifth bit data, a sixth bit data, and a seventh bit data; the step of determining the first initial display data error-prone in the initial display data, and the second initial display data not error-prone in the initial display data comprises:
   determining whether the first target data has a continuous preset number of 0 or 1 according to a preset signal transmission criterion;
   if yes, the first target data is determined to be the first initial display data error-prone;
   if no, the first target data is determined to be the second initial display data not error-prone.

3. The encoding method as claimed in claim 2, wherein the step of determining whether the first target data has the continuous preset number of 0 or 1 according to the preset signal transmission criterion comprises:
   determining whether logical values from the fourth bit data to the seventh bit data in the first target data are the same.

4. The encoding method as claimed in claim 2, wherein the step of determining whether the first target data has the continuous preset number of 0 or 1 according to the preset signal transmission criterion comprises:

determining whether logical values from the zeroth bit data to the fifth bit data in the first target data are the same.

5. The encoding method as claimed in claim 2, wherein the step of determining whether the first target data has the continuous preset number of 0 or 1 according to the preset signal transmission criterion comprises:
determining whether logical values from the first bit data to the sixth bit data in the first target data are the same.

6. The encoding method as claimed in claim 2, wherein the step of determining whether the first target data has the continuous preset number of 0 or 1 according to the preset signal transmission criterion comprises:
determining whether logical values from the zeroth bit data to the fourth bit data in the first target data are the same, and logic values of the sixth bit data and a seventh bit data are opposite.

7. The encoding method as claimed in claim 2, wherein the first initial display data comprises at least the eight-bit data, and taking any data of the first initial display data as a second target data; the step of encoding the first initial display data by the first preset logic operation to obtain the first display data comprises:
performing an exclusive OR operation or an exclusive NOR operation on a zeroth bit data and a first bit data in the second target data to obtain an exclusive OR value, or an exclusive NOR value;
determining whether the exclusive OR value or the exclusive NOR value is 1;
if the exclusive OR value or the exclusive NOR value is 1, performing a negation operation on a first preset data in the second target data to obtain a first bit data; and
replacing the first preset data in the second target data with the first bit data to obtain the first display data.

8. The encoding method as claimed in claim 7, wherein the step of replacing the first preset data in the second target data with the first bit data to obtain the first display data comprises:
taking the zeroth bit data in the second target data as a first encoded data;
performing a negation operation on the first encoded data to obtain a second bit data; and
inserting the second bit data into a first bit of the second target data to obtain the first display data.

9. The encoding method as claimed in claim 8, wherein the method further comprises:
if the exclusive OR value or the exclusive NOR value is not 1, performing a negation operation on a second preset data in the second target data to obtain a third bit data; and
replacing the second preset data in the second target data with the third bit data to obtain the first display data.

10. The encoding method as claimed in claim 8, wherein the second initial display data comprises at least the eight-bit data, and taking any data of the second initial display data as a third target data; the step of encoding the second initial display data by the second preset logic operation to obtain the second display data comprises:
selecting a zeroth bit data in the third target data as a second encoded data;
performing a negation operation on the second encoded data to obtain a third bit data; and
inserting the third bit data into a first bit of the third target data to obtain the second display data.

11. A computer device, wherein the computer device comprises:
one or more processors;
a memory; and
one or more application programs, wherein the one or more application programs are stored in the memory and configured to be executed by the processor to implement the encoding method according to claim 1.

12. A computer-readable storage medium with a computer program stored thereon, and the computer program is loaded by a processor to execute steps in the encoding method as claimed in claim 1.

13. An encoding device, wherein the encoding device comprises:
a obtaining unit, configured to obtain an initial display data to be transmitted;
a determining unit, configured to determine a first initial display data error-prone in the initial display data, and a second initial display data not error-prone in the initial display data;
a first encoding unit, configured to encode the first initial display data by a first preset logic operation to obtain a first display data;
a second encoding unit, configured to encode the second initial display data by a second preset logic operation to obtain a second display data; and
an outputting unit, configured to output an encoded display data, and the encoded display data comprises the first display data and the second display data.

14. The encoding device as claimed in claim 13, wherein the initial display data comprises at least one eight-bit data, and taking any data of the initial display data as a first target data, and the determining unit is configured to:
determine whether the first target data has a continuous preset number of 0 or 1 according to a preset signal transmission criterion;
determine the first target data to be the first initial display data error-prone, if yes; and
determine the first target data to be the second initial display data not error-prone, if no.

15. The encoding device as claimed in claim 14, wherein the determining unit is further configured to:
determine whether logical values from a fourth bit data to a seventh bit data in the first target data are the same; or
determine whether logical values from a zeroth bit data to a fifth bit data in the first target data are the same.

16. The encoding device as claimed in claim 14, wherein the first initial display data comprises at least the eight-bit data, and taking any data of the first initial display data as a second target data; the first encoding unit is configured to:
perform an exclusive OR operation or an exclusive NOR operation on a zeroth bit data and a first bit data in the second target data to obtain an exclusive OR value, or an exclusive NOR value;
determine whether the exclusive OR value or the exclusive NOR value is 1;
perform a negation operation on a first preset data in the second target data to obtain a first bit data, if the exclusive OR value or the exclusive NOR value is 1; and
replace the first preset data in the second target data with the first bit data to obtain the first display data.

17. The encoding device as claimed in claim 14, wherein the first encoding unit is configured to:
take the zeroth bit data in the second target data as a first encoded data;
perform a negation operation on the first encoded data to obtain a second bit data; and insert the second bit data into a first bit of the second target data to obtain the first display data.

18. The encoding device as claimed in claim 17, wherein the second initial display data comprises at least the eight-bit data, and taking any data of the second initial display data as a third target data; and the second encoding unit is configured to:
- select a zeroth bit data in the third target data as a second encoded data;
- perform a negation operation on the second encoded data to obtain a third bit data; and
- insert the third bit data into a first bit of the third target data to obtain the second display data.

* * * * *